(12) United States Patent
Shridhar et al.

(10) Patent No.: US 7,577,881 B1
(45) Date of Patent: Aug. 18, 2009

(54) METHOD AND APPARATUS FOR AN INTERLEAVER

(75) Inventors: Avadhani Shridhar, Santa Clara, CA (US); Abhijit Shah, Pacifica, CA (US)

(73) Assignee: Ikanos Communications Inc., Fremont, CA (US)

( * ) Notice: Subject to any disclaimer, the term of this patent is extended or adjusted under 35 U.S.C. 154(b) by 651 days.

(21) Appl. No.: 11/431,219

(22) Filed: May 9, 2006

Related U.S. Application Data

(60) Provisional application No. 60/679,634, filed on May 10, 2005.

(51) Int. Cl.
*G11C 29/00* (2006.01)
(52) U.S. Cl. .................................... 714/702
(58) Field of Classification Search ......... 714/701–702, 714/746, 752
See application file for complete search history.

(56) References Cited

U.S. PATENT DOCUMENTS

| | | | |
|---|---|---|---|
| 4,843,607 A * | 6/1989 | Tong | 714/784 |
| 2006/0107174 A1* | 5/2006 | Heise | 714/755 |

* cited by examiner

*Primary Examiner*—Shelly A Chase
(74) *Attorney, Agent, or Firm*—IP Creators; Charles C Cary

(57) ABSTRACT

A modem configured to couple to a communication medium for establishing a communication channel thereon. The modem includes an interleaver component configurable as to interleaver parameters 'I, D' corresponding to block length and depth respectively. An interleaver memory buffers the communication channel. An interleaver controller controls writing to and reading from the memory of successive data elements of the communication channel with a quantity 'I' pairs of write and read pointers. Each pair or write and read pointers identifies memory locations corresponding with an input and output respectively of an associated one of 'I' virtual first-in-first-out ('v-FIFO') buffers in the memory. Control of the pointers required to read out the stored data elements in interleaved fashion is limited to shifting all pointers uniformly by one address block in each interleaver block cycle, which simplifies pointer management.

16 Claims, 9 Drawing Sheets

Interleaver

Shift

Shift

FIG. 5C Shift

FIG. 5E Shift

METHOD AND APPARATUS FOR AN INTERLEAVER

CROSS REFERENCE TO RELATED APPLICATION

This application claims the benefit of prior filed Provisional Application No. 60/679,634 filed on May 10, 2005 entitled "Method and Apparatus for an Interleaver" which is incorporated herein by reference in its entirety as if fully set forth herein.

BACKGROUND OF THE INVENTION

1. Field of Invention

The present invention is generally related to modems, and more particularly to digital modems.

2. Description of the Related Art

Digital subscriber line (DSL) technologies are being called on to provide large bandwidth, e.g. up to 100 Mbps links to homes and offices, for video on demand, teleconferencing, and other high throughput applications. To meet these elevated data rates DSL communications protocols such as discrete multitone (DMT) have been developed. In DMT communications each channel is split into sub-channels each with its own tone or sub-carrier to which a corresponding number of bits of the communication stream is assigned. The errorless transport of these bits on communication channels with low signal to noise ratios necessitated by the high data rates, requires extensive error correction overhead, which add redundant bits to the transmitted data to aid in the recovery of the errored data at the receiver. Forward error correction is typically combined with interleaving which provides additional levels of protection to what is known as 'impulse noise' on the communication channel. Interleaving spreads adjacent bits in the transmit stream over intervals greater than the duration of expected impulse noise thereby improving the error-correction performance.

Both interleave and forward error correction parameters vary depending on the communication standard, operator constraints and line constraints. Adjustments to one parameter typically effect others, and may significantly alter the performance of the communication channel.

What is needed are means for rapid setup and simplified block processing for interleaving and deinterleaving a communication channel.

SUMMARY OF THE INVENTION

A modem having shared and discrete components forming a transmit path and a receive path is disclosed. The modem is configured to couple to a communication medium for establishing a communication channel thereon. The modem includes an interleaver component for interleaving the communication channel. The interleaver component is configurable as to interleaver parameters 'I, D' corresponding to block length and depth respectively. The interleaver has a memory and a controller. The memory buffers the communication channel. The controller controls writing to and reading from the memory of successive data elements of the communication channel with a quantity 'I' pairs of write and read pointers. Each pair or write and read pointers identifies memory locations corresponding with an input and output respectively of an associated one of 'I' virtual first-in-first-out ('v-FIFO') buffers in the memory. Control of the pointers required to read out the stored data elements in interleaved fashion is limited to shifting all pointers uniformly by one address block in each interleaver block cycle, which simplifies pointer management.

BRIEF DESCRIPTION OF THE DRAWINGS

These and other features and advantages of the present invention will become more apparent to those skilled in the art from the following detailed description in conjunction with the appended drawings in which:

FIGS. 5B-5F are data structure diagrams showing a succession of representative deinterleaver block cycles.

DETAILED DESCRIPTION OF THE EMBODIMENTS

A method and apparatus for determining codeword interleaver parameters is disclosed. All digital communication experiences signal interference, and communication protocols which support multiple sub-channels such as discrete multi tone (DMT) and orthogonal frequency division multiplexed (OFDM) are no exception. Interference can effect both the amplitude and the phase of the sub-channels. At the receiver the data has to be separated from the noise. One popular technique for achieving the separation of data from the noise in a received signal is known as in-channel forward error correction (FEC). FEC introduces additional redundant bits into communications between modems and additional processing overhead to handle the transmission and reception of a stream of digital information. The redundant bits are added at the transmitter by application of any of a number of FEC algorithms in a process known as encoding the data. At the receiver the same algorithm is performed to detect and remove errors in the transmitted data in a process known as decoding the signal.

With each improvement in bandwidth of multiple sub-channel communication systems there is a corresponding increase in noise, with the potential to reduce signal integrity to unacceptable levels. The modem of the current invention provides the signal integrity required to support high transmission rates and service level requirements.

In each of the Figures the reference numbers for elements introduced in each Figure correspond with the number of the Figure. For example elements referenced in FIG. 1 have reference numbers between 100-199. Elements referenced in FIG. 2 have reference numbers between 200-299, and so forth. For purposes of clarity elements first referenced in an earlier Figure may again appear in a subsequent figure.

Figure 1:
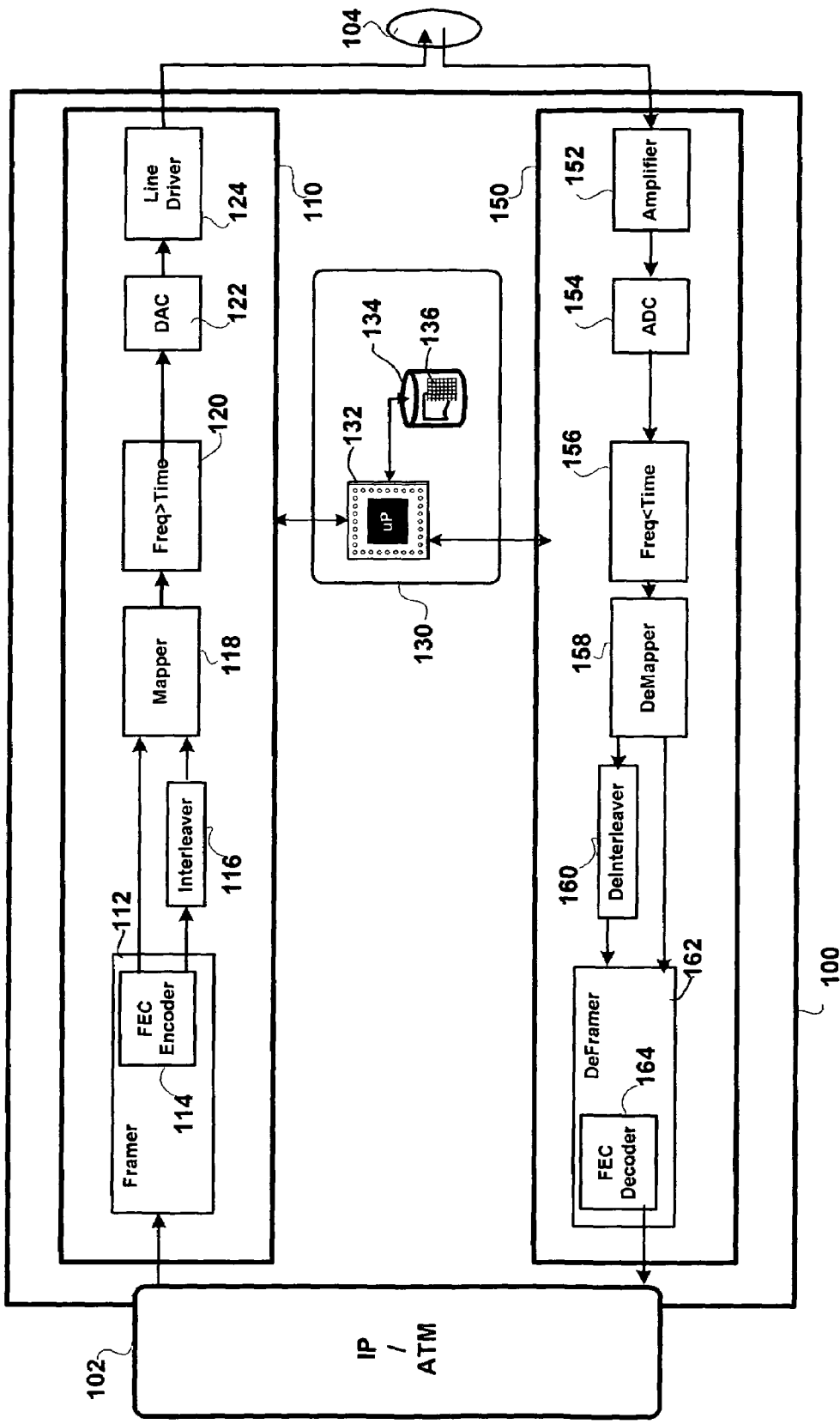
FIG. 1 is a hardware block diagram of a modem with an interleaver and deinterleaver positioned in accordance with an embodiment of the invention.

FIG. 1 is a hardware block diagram of a modem with an interleaver and deinterleaver positioned in accordance with an embodiment of the invention. The modem 100 includes a plurality of shared and discrete components coupled to one another to form a transmit path 110 and a receive path 150. In the embodiment shown the modem is configured to couple an Asynchronous Transfer Mode (ATM) or Transport Control Protocol/Internet Protocol (TCP/IP) network (not shown) to a wired or wireless communication medium 104. The transmit and receive path couple on one end to a communications medium 104, e.g. an X-DSL communications medium such as a subscriber line, and on the other end to an packet or cell based network via interface 102. The transmit and receive path components operate under the control of a processor component 130. The processor component handles the modem setup and interface between the transmit and receive paths, including in an embodiment of the invention the determination of codeword and interleaver parameters. The processor component includes a processor 132, memory 134 and associated program code and lookup tables 136. The processor component in an embodiment of the invention implements the processes for codeword and interleaver parameters which satisfy the various constraints on the communication channel(s) supported by the transmit and receive paths of the modem.

The components of this embodiment of the transmit path 110 include a framer 112, an interleaver 116 a mapper 118, a frequency-to-time domain converter 120, a digital-to-analog (DAC) converter 122 and a line driver 124. The framer includes a forward error correction (FEC) encoder 114. The components of this embodiment of the receive path 150 include a low noise amplifier 152, an analog-to-digital (ADC) converter 154, a time-to-frequency domain converter 156, a demapper 158, a deinterleaver 160 and a de-framer 162. The deframer includes a FEC decoder 164.

FEC encoding is used to assist the receiver in checking for and recovering data received in error. FEC encoding in general introduces redundancy into the transmitted data stream, to allow such error recovery without retransmission of data. FEC encoding may be implemented as a single type, e.g. block or convolutional, or as one or more types operating in combination. In an embodiment of the invention shown in FIG. 1, the FEC encoder 114 and decoder 164 implement a block type code identified as Reed-Solomon encoding.

The interleaver 116 and the deinterleaver 160 on the transmit and receive paths respectively, include configurable interleaver block length 'I' and depth 'D' parameters.

The components of the modem shown in this embodiment of the invention, particularly the frequency-to-time and time-to-frequency domain components are compatible with multi-tone modulation protocols such as: discrete multi-tone (DMT) and orthogonal frequency division multiplexed (OFDM) modulation protocols. In alternate embodiments of the invention in which the modem supports single carrier or carrierless modulation protocols such as: AM/PM (CAP) such component would not be required. The codeword interleaver disclosed in the following drawings and accompanying text are equally compatible with a range of wired and wireless communication devices including but not limited to modems such as that shown in FIG. 1.

Figure 2:
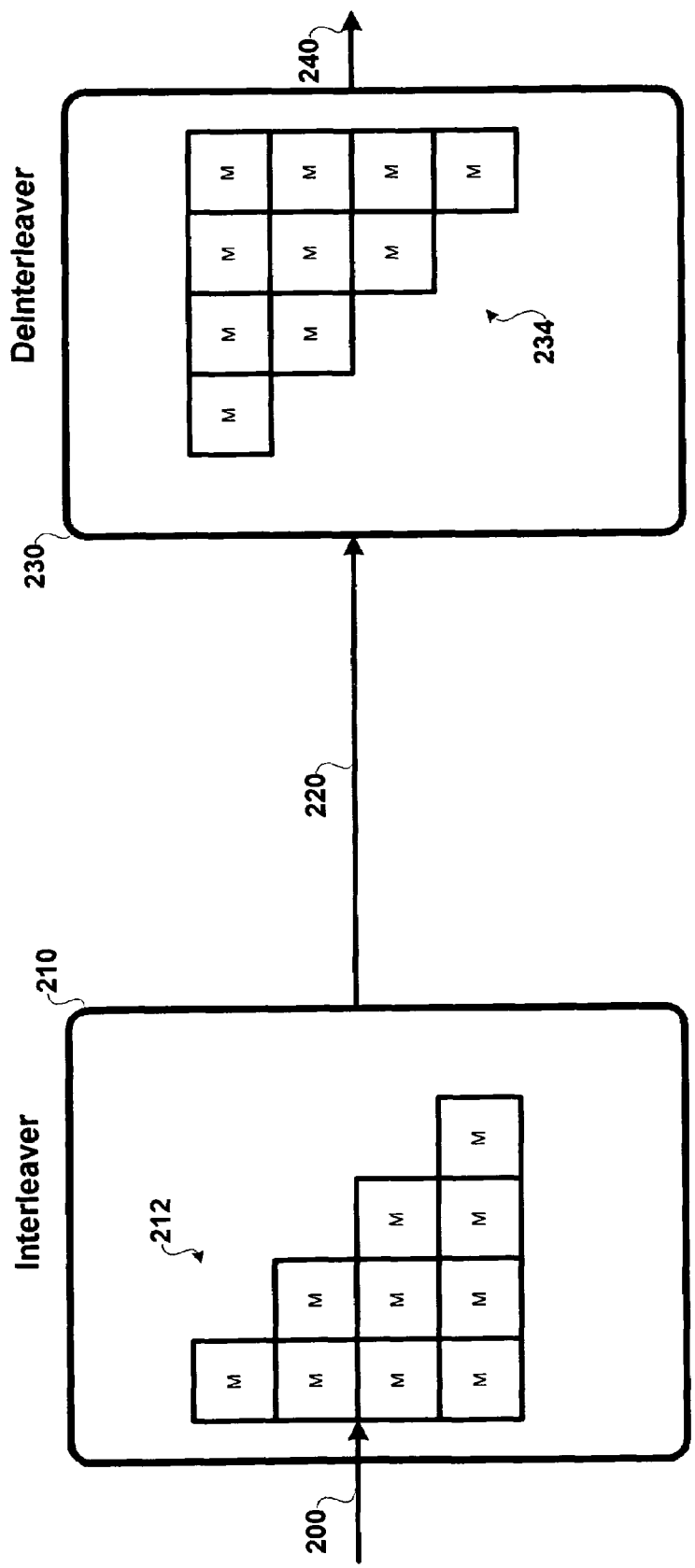
FIG. 2 is a hardware block diagram of an opposing interleaver and deinterleavers suitable for use in accordance with an embodiment of the invention.

FIG. 2 is a hardware block diagram of an opposing interleaver 210 and deinterleaver 230 coupled to one another across a communication medium 220. These components would be part of the transmit path and receive path respectively, of an opposing pair of wireless or wired communication devices such as the modem shown in FIG. 1. The interleaver 210 accepts input of a communication channel 200 which is input to delay buffers 212 and read out in interleaved order to the communication medium 220. At the deinterleaver the interleaved communication channel is input to a complementary set of delay buffers 234 and read out in deinterleaved order into a deinterleaved output stream 240. Complex high speed communications protocols typically call for one or more communication paths at least one of which implements interleaving to reduce errors due to impulse or other intermittent noise types. Interleavers are used to reduce the effect of impulse noise by distributing adjacent bytes across a transmission interval greater than the expected impulse noise intervals. Interleaving is typically used with communication systems which also implement some form of forward error correction (FEC) with the FEC encoder providing the input to the interleaver.

A typical convolutional interleaver such as that shown in FIG. 2 is characterized by interleaver depth(D), interleave block length (I) interleaving depth parameters (M and k).

The relationship between these parameters is given in the following Equation 1:

$$D=MI+k \qquad \text{Equation 1}$$

Increasing the interleaver depth improves the error correction capability of a given system with a concomitant increase in latency. Latency corresponds to the time required for data to traverse the end-to-end communication path between opposing interleavers. For certain types of data such as text files significant increases in latency may be tolerable. For other types of 'real time' data such as audio or video data significant increases in latency can not be tolerated.

The embodiment of the interleaver shown in FIG. 2 is a triangular interleaver which is a convolutional type interleaver with 'k'=1. As a general rule, the parameters I and D have to be co-prime, i.e. can not have a common divisor. In an embodiment of the invention a general convolutional interleaver may be implemented as a number of parallel delay lines as shown in FIG. 2. Interleave path data is split in consecutive blocks of I bytes.

Figure 3:
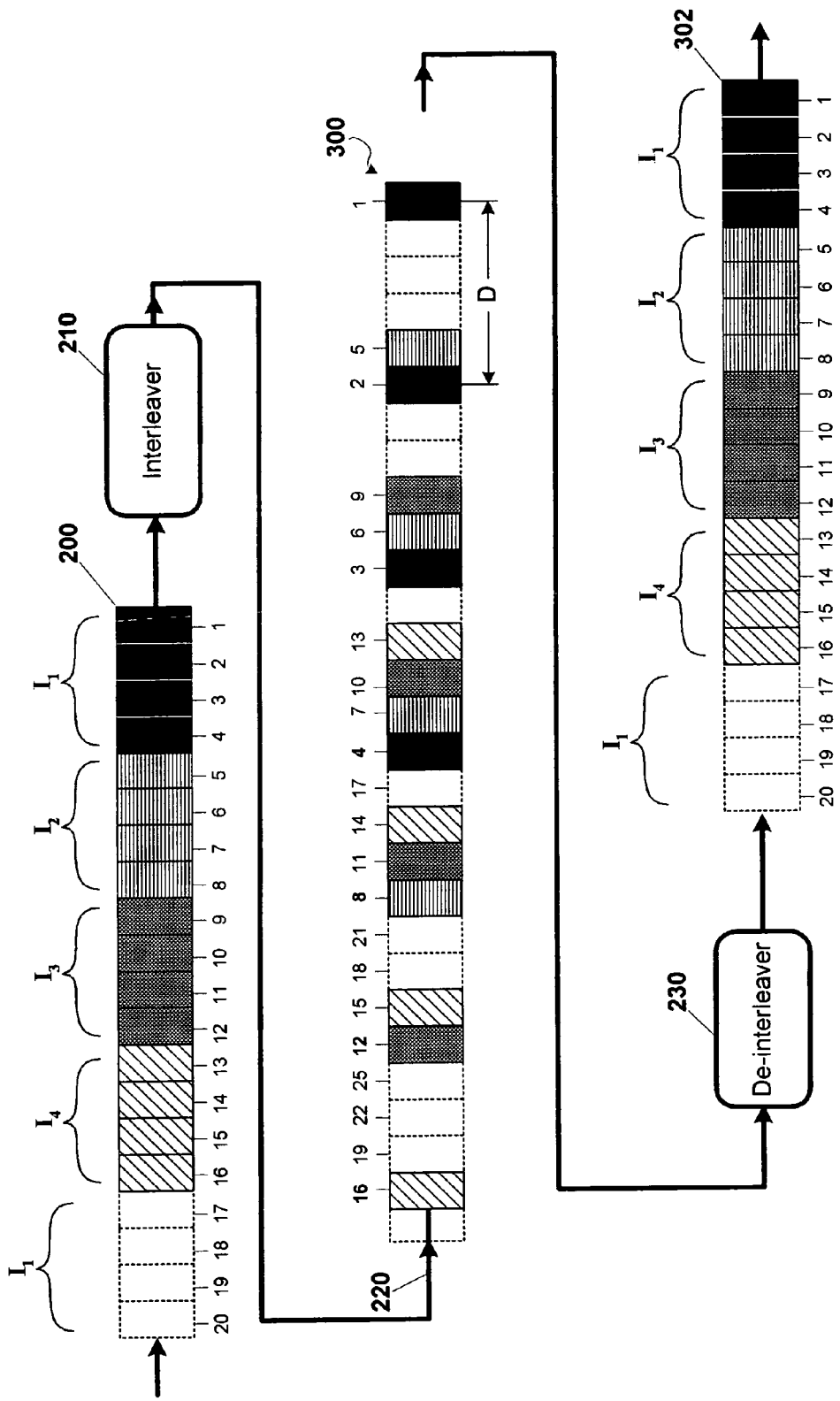
FIG. 3 is a data structure diagram showing representative interleaver and deinterleaver input and output streams.

FIG. 3 is a data structure diagram showing representative interleaver and deinterleaver input and output streams. In a triangular interleaver bytes within the same interleaver block (i.e. bytes within the same "column" in FIG. 2 are a distance D apart after interleaving. Bytes that have the same block index, but belong to consecutive interleaver blocks (i.e. bytes within the same "row" in FIG. 2) are a distance I apart after interleaving. Thus interleaving distributes the bytes within a codeword as illustrated in FIG. 3. The bytes along a "row" are all clustered within a distance D, at intervals of length I. In the particular example shown in FIG. 3 the codeword size, N=8; the interleaver block length, I=4; and the interleaver depth parameter, M=1. Thus 'q'=N/I=2; and the interleaver depth, D=5. An error burst of length D will affect at most two bytes from each codeword. Error correction capability has to be dimensioned for correcting 2 bytes per codeword.

This in turn means that after interleaving, any set of D consecutive bytes in the interleaved communication channel 300 contains at most q bytes belonging to the same codeword. Consequently, this also means that any noise burst of length D will affect at most q bytes per codeword. If the correction capability of the RS code is chosen appropriately (i.e. q or higher), the RS coding will be able to correct the error burst completely.

Figure 4A:
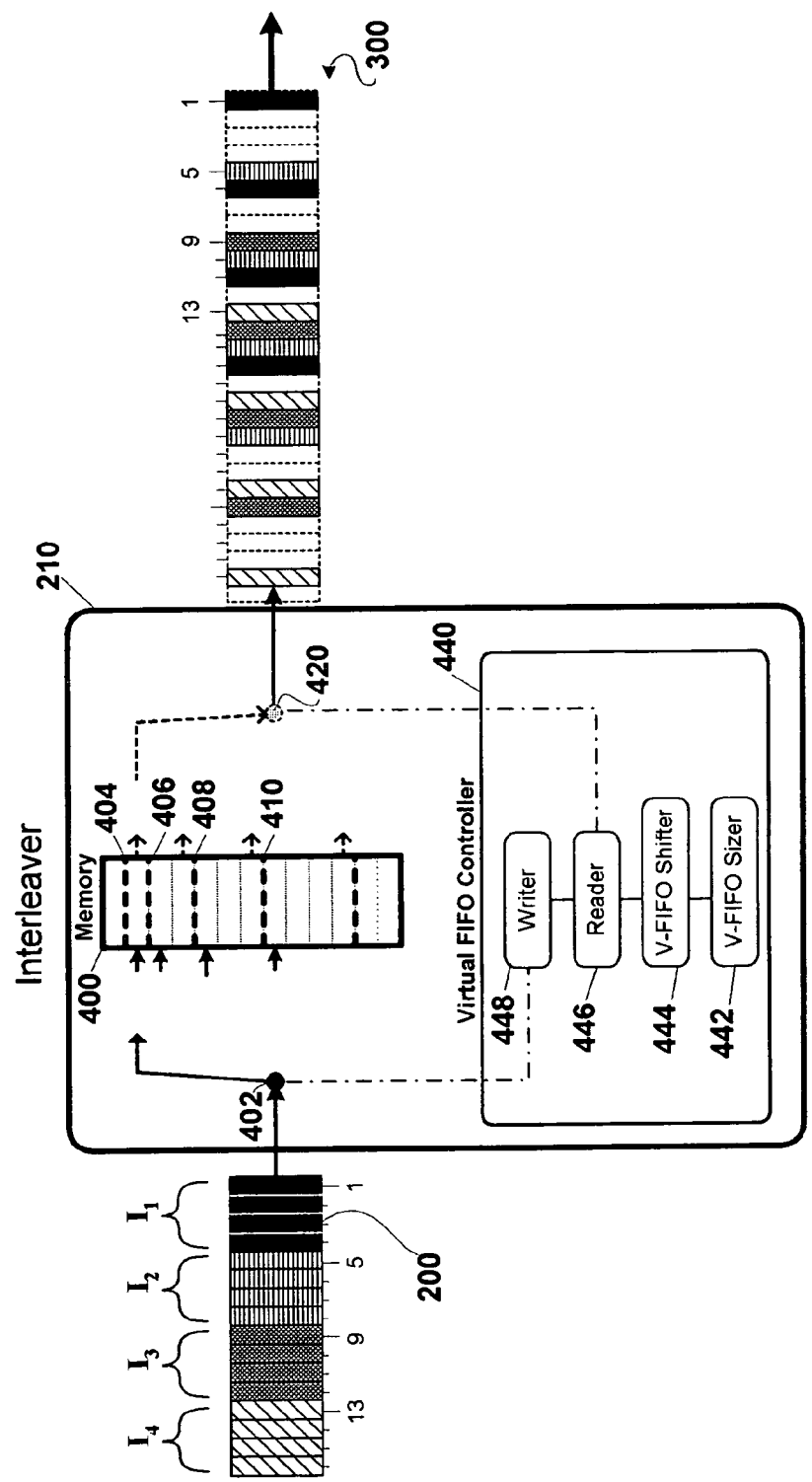
FIG. 4A is a hardware and software block diagram of an interleaver in accordance with an embodiment of the invention.

FIG. 4A is a hardware and software block diagram of an interleaver 210 in accordance with an embodiment of the invention. The interleaver includes a memory 400 and a virtual first-in-first-out ('v-FIFO') controller 440 for controlling the writing and reading of a communication channel into and out of the memory. The interleaver is configurable as to interleaver parameters "I and D" corresponding to block length and depth respectively. The v-FIFO controller in this embodiment is broken up into modules including: v-FIFO sizer module 442, v-FIFO shifter module 444, reader module 446 and writer module 448.

The v-FIFO sizer 442 module determines for a given set of interleaver parameters the number of pairs of write and read pointers and the offsets between them. These pointers and offsets establish the v-FIFOs 404, 406, 408, 410 shown in memory 400. Each v-FIFO has an input end delineated by the associated write pointer shown on the left of memory; an output end delineated by the associated read pointer shown on the right of memory; and an offset between write and read pointers corresponding to the length of the buffer in accordance with the following Equation 2A.

> $1+iM+\text{FLOOR}(ik/I)$; where writing of all data elements in each interleaver block cycle is completed before readout of stored data elements; and
>
> $iM+\text{FLOOR}(ik/I)$ where write and read of individual data elements are alternated in each interleaver block cycle; Equation 2A where 'i' the v-FIFO buffer index ranges from 0 to (I−1).

The writer module 448 handles the writing of each element of each successive block of an incoming communication channel 200 to the input end of each v-FIFO as delineated by the corresponding write pointer via address selector 402. The order of writing each successive element of each block of the incoming communication channel corresponds to Equation 3.

> $i$ Equation 3 where 'i' the v-FIFO buffer index ranges from 0 to (I−1).

The reader module 446 handles the reading of each stored element of the communication channel from the output ends of each v-FIFO as delineated by the corresponding read pointer via address selector 420 into the interleaved communication channel datastream 300. The order of reading each stored element at the output of each v-FIFO corresponds to Equation 4.

> $ik \bmod I$ Equation 4 where 'i' the v-FIFO buffer index ranges from 0 to (I−1).

The v-FIFO shifter module 444 shifts all pointers, i.e. read and write pointers, by a uniform amount of memory, e.g. one byte, at the end of each interleaver block cycle thereby completing the cycle with a shift of each v-FIFO buffer by the corresponding amount.

Figure 4B:
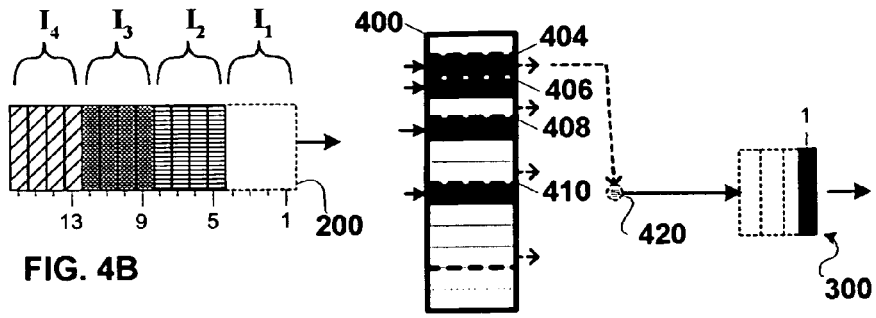
FIGS. 4B-4F are data structure diagrams showing a succession of representative interleaver block cycles.
Figure 4C:
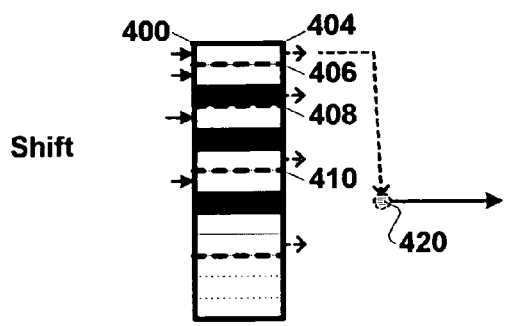

FIGS. 4B-4F are data structure diagrams showing a succession of representative interleaver block cycles. In FIG. 4B block $I_1$ comprising 4 elements is written into the input of v-FIFOs 404, 406 408 and 410 as identified by the corresponding write pointers. Then the stored elements at the end of each v-FIFO, as identified by the corresponding read pointers, are read out into the interleaved datastream 300. Only one v-FIFO 404 has stored data at this point that is located at the output of the buffer, and which is therefore written into the interleaved output 300. The interleaver block cycle is completed in FIG. 4C with the shift of all write and read pointers by one unit of memory, e.g. one byte.

Figure 4D:
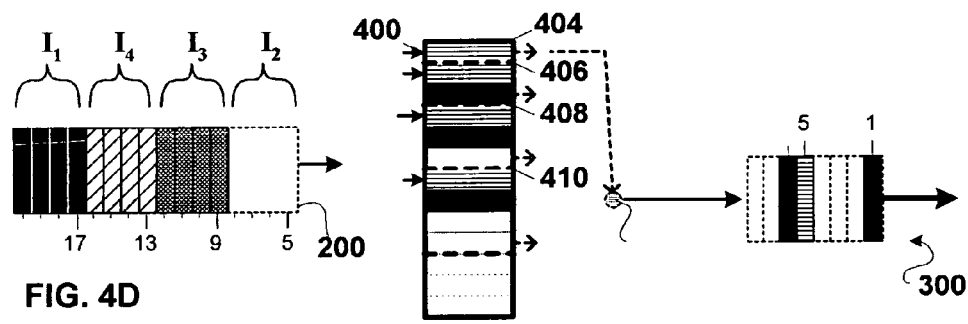

The next interleaver block cycle begins in FIG. 4D in which the next interleaver block $I_2$ comprising 4 elements is written into the input of v-FIFOs 404, 406 408 and 410 as identified by the corresponding write pointers. Then the stored elements at the end of each v-FIFO, as identified by the corresponding read pointers, are read out into the interleaved datastream 300. Two v-FIFOs 404 and 406 have stored data at this point that is located at the output of the buffer, and which is therefore written into the interleaved output 300. The interleaver block cycle is completed in FIG. 4E with the shift of all write and read pointers by one unit of memory, e.g. one byte. This time a memory boundary is reached so that one of the pointers, i.e. write pointer for buffer 404 wraps to the bottom of memory 400.

Figure 4E:
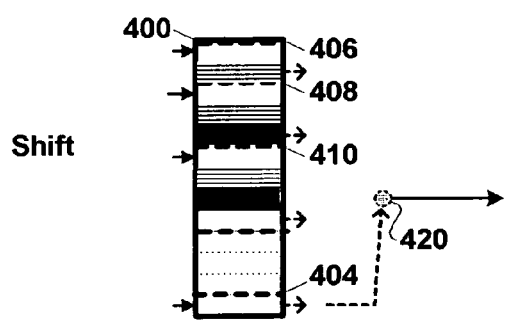
Figure 4F:
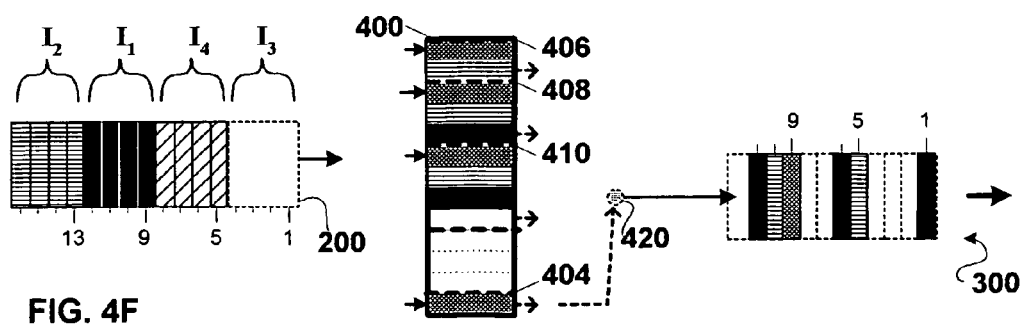

The next interleaver block cycle begins in FIG. 4E in which the next interleaver block $I_3$ comprising 4 elements is written into the input of v-FIFOs 404, 406 408 and 410 as identified by the corresponding write pointers. Then the stored elements at the end of each v-FIFO, as identified by the corresponding read pointers, are read out into the interleaved datastream 300. Three v-FIFOs 404, 406 and 408 have stored data at this point that is located at the output of the buffer, and which is therefore written into the interleaved output 300. The interleaver block cycle is then completed with a shift (not shown) of one memory unit as discussed above.

Figure 5A:
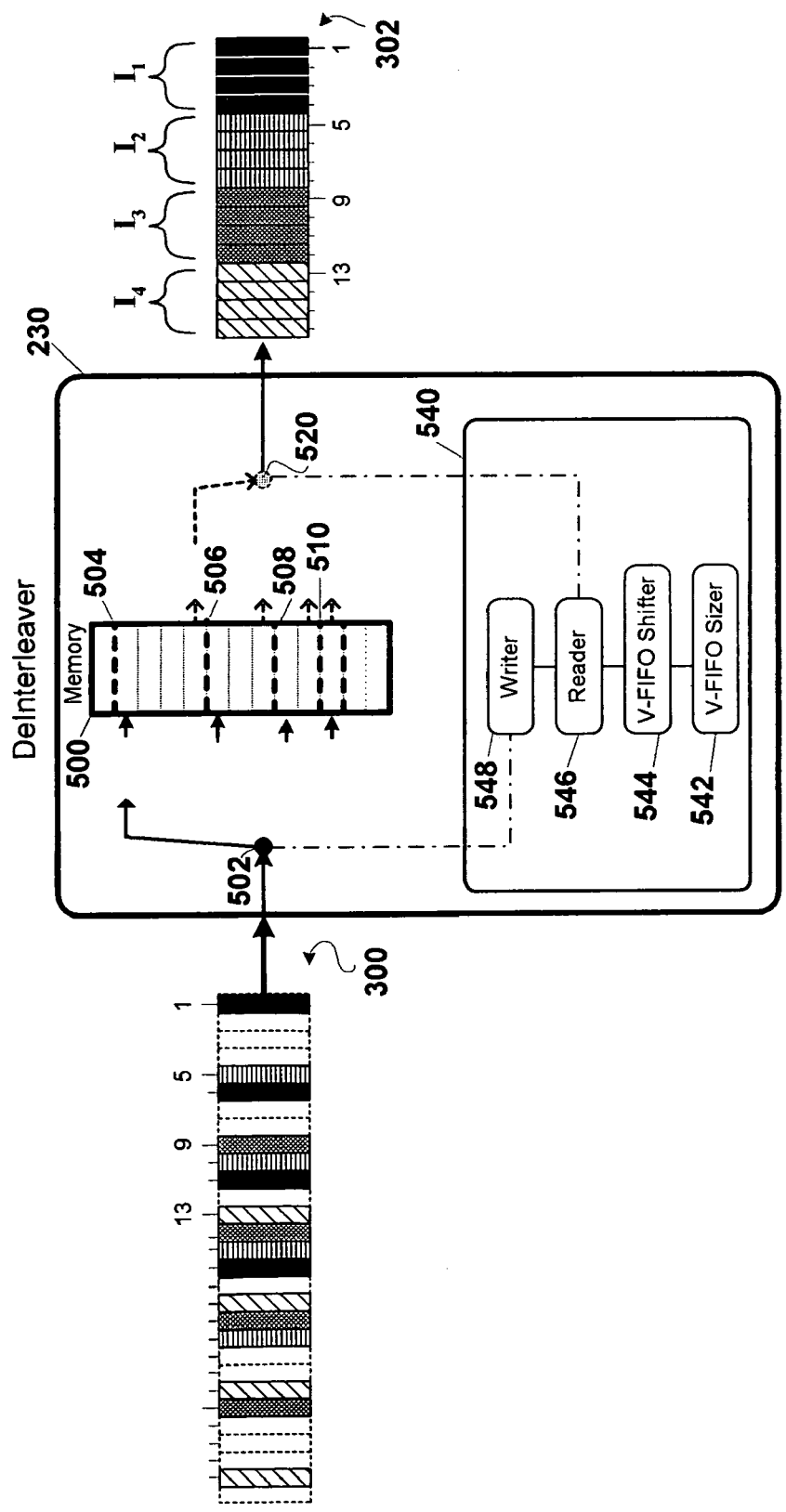
FIG. 5A is a hardware and software block diagram of an deinterleaver in accordance with an embodiment of the invention.

FIG. 5A is a hardware and software block diagram of an deinterleaver 230 in accordance with an embodiment of the invention. The deinterleaver includes a memory 500 and a virtual first-in-first-out ('v-FIFO') controller 540 for controlling the writing and reading of a communication channel into and out of the memory. The deinterleaver is configurable as to deinterleaver parameters 'I, D' corresponding to block length and depth respectively. The v-FIFO controller in this embodiment is broken up into modules including: v-FIFO sizer module 542, v-FIFO shifter module 544, reader module 546 and writer module 548.

The v-FIFO sizer 542 module determines for a given set of deinterleaver parameters the number of pairs of write and read pointers and the offsets between them. These pointers and offsets establish the v-FIFOs 504, 506, 508, 510 shown in memory 500. Each v-FIFO has an input end delineated by the associated write pointer shown on the left of memory; an output end delineated by the associated read pointer shown on the right of memory; and an offset between write and read pointers corresponding to the length of the buffer in accordance with the following Equation 2B:

> $1+(I-1-i)M+\text{FLOOR}((I-1-i)k/1)$; where writing of all data elements in each interleaver block cycle is completed before readout of stored data elements; and
>
> $(I-1-i)M+\text{FLOOR}((I-1-i)k/I)$ where write and read of individual data elements are alternated in each interleaver block cycle; Equation 2B where 'i' the v-FIFO buffer index ranges from 0 to (I−1).

The writer module 548 handles the writing of each element of each successive block of an incoming interleaved communication channel 300 to the input end of each v-FIFO as delineated by the corresponding write pointer via address selector 502. The order of writing each successive element of each block of the interleaved incoming communication channel 300 corresponds to Equation 4, i.e. ik MOD I, where 'i' the v-FIFO buffer index ranges from 0 to (I−1).

The reader module 546 handles the reading of each stored element of the communication channel from the output ends of each v-FIFO as delineated by the corresponding read pointer via address selector 520 into the deinterleaved communication channel datastream 302. The order of reading each stored element at the output of each v-FIFO corresponds to Equation 3, i.e. i, where 'i' the v-FIFO buffer index ranges from 0 to(I−1).

The De-interleaver has an initial phase for the first D blocks of data (i.e., for the first D.I data values), where data elements are written to the de-interleaver memory without any reading. After this initial phase, the de-interleaver memory holds a first block of data which can be read out. If the write of a data value is alternated with a read of a data value, then the initial phase lasts until the first value of the $D^{th}$ block is written (i.e., until ((I−1).D)+1 values are written), after which the first value can be read out.

The v-FIFO shifter module 544 shifts all pointers, i.e. read and write pointers, by a uniform amount of memory, e.g. one byte, at the end of each deinterleaver block cycle thereby completing the cycle with a shift of each v-FIFO buffer by the corresponding amount.

Figure 5B:
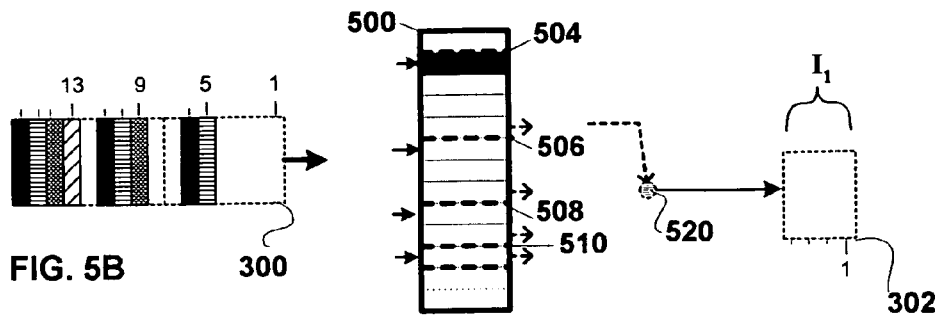

FIGS. 5B-5F are data structure diagrams showing a succession of representative deinterleaver block cycles. In FIG. 5B a block comprising 4 elements of the interleaved communication channel is written into the input of v-FIFOs 504, 506 508 and 510 as identified by the corresponding write pointers. Then the stored elements at the end of each v-FIFO, as identified by the corresponding read pointers, are read out into the deinterleaved datastream 302. No v-FIFO has stored data at this point that is located at the output of the buffer therefore the deinterleaved output is null. The deinterleaver block cycle is completed in FIG. 5C with the shift of all read and write pointers by one unit of memory, e.g. one byte.

Figure 5D:
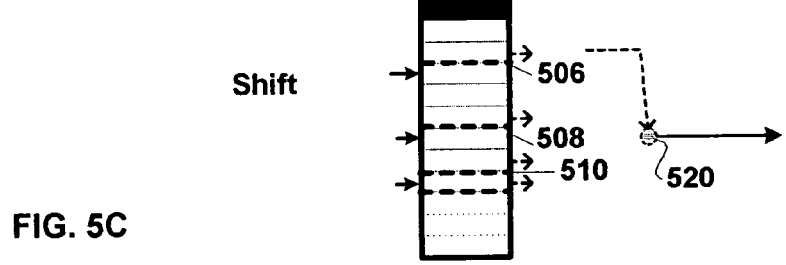
Figure 5D:
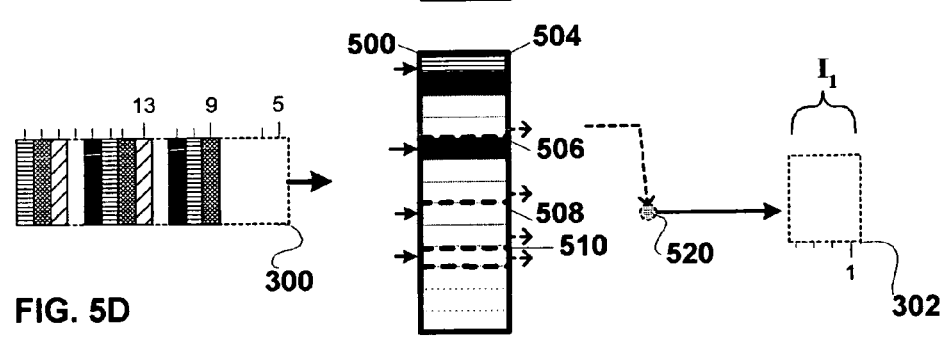
Figure 5F:
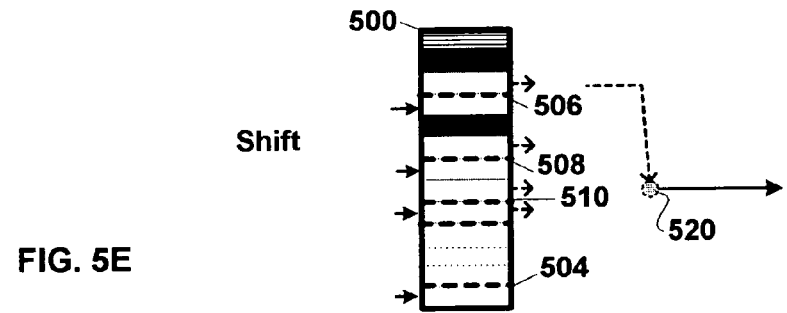
Figure 5F:
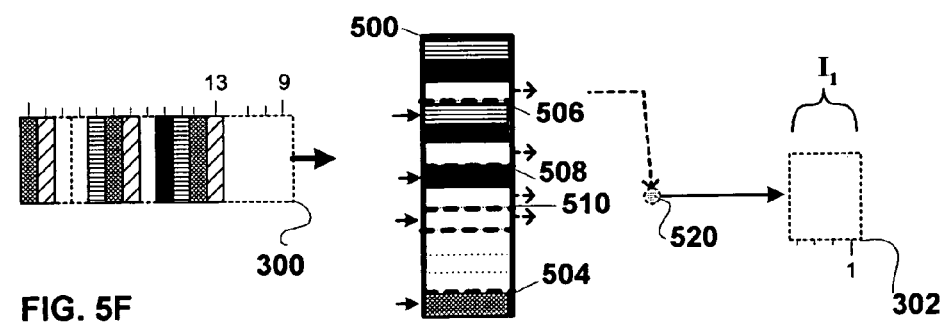

The next deinterleaver block cycle begins in FIG. 5D in which the next deinterleaver block comprising 4 elements is written into the input of v-FIFOs 504, 506 508 and 510 as identified by the corresponding write pointers. Then the stored elements at the end of each v-FIFO, as identified by the corresponding read pointers, are read out into the deinterleaved datastream 302. No v-FIFO has stored data at this point that is located at the output of the buffer therefore the deinterleaved output is null. The deinterleaver block cycle is completed in FIG. 5E with the shift of all write and read pointers by one unit of memory, e.g. one byte. This time a memory boundary is reached so that one of the pointers, i.e. write pointer for buffer 504 wraps to the bottom of memory 500.

The next deinterleaver block cycle begins in FIG. 5E in which the next deinterleaver block comprising 4 elements is written into the input of v-FIFOs 504, 506 508 and 510 as identified by the corresponding write pointers. Then the stored elements at the end of each v-FIFO, as identified by the corresponding read pointers, are read out into the deinterleaved datastream 302. No v-FIFO has stored data at this point that is located at the output of the buffer therefore the deinterleaved output is null. The deinterleaver block cycle is then completed with a shift (not shown) of one memory unit as discussed above.

Figure 6:
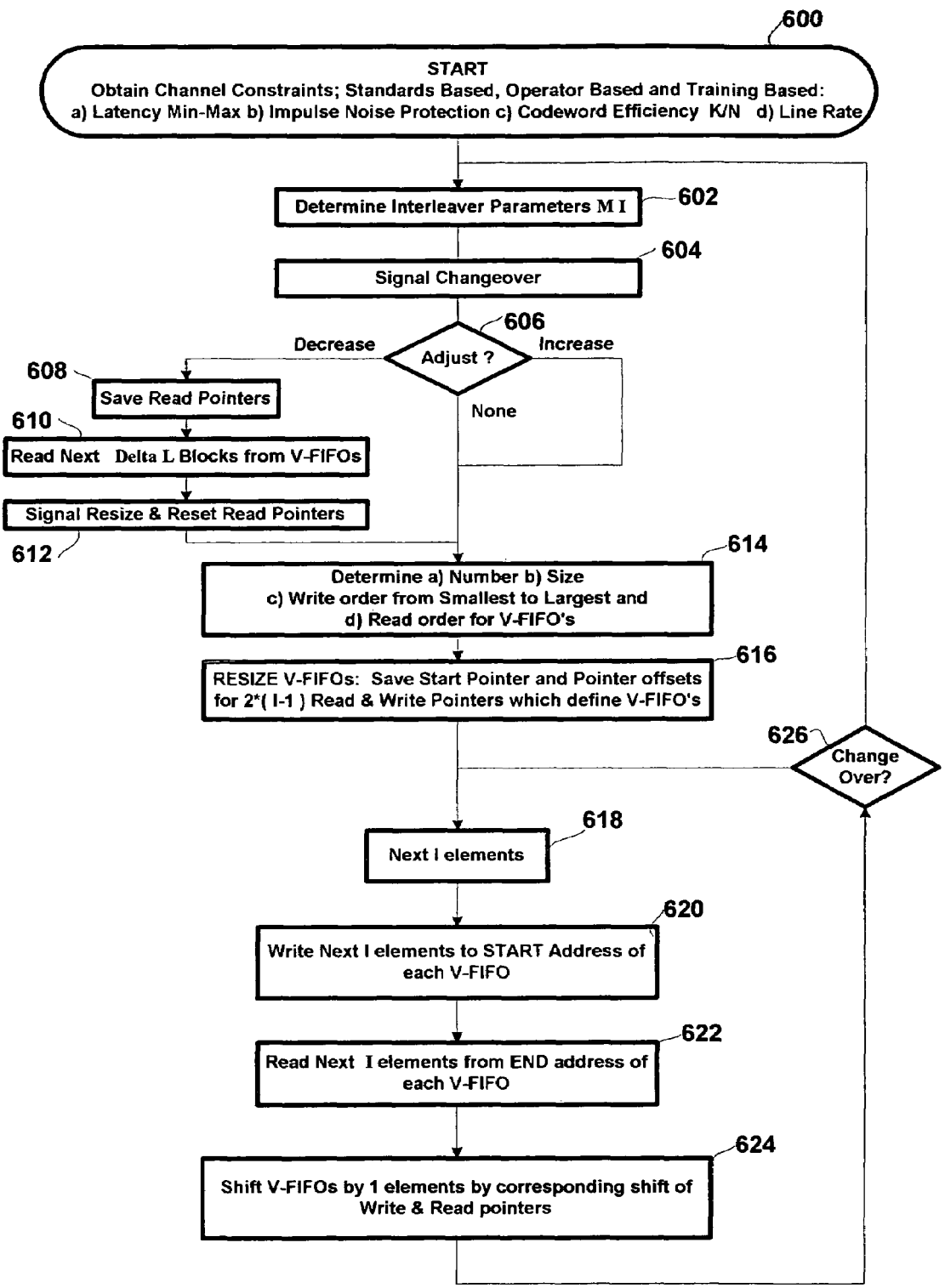
FIG. 6 is a process flow diagram of the codeword interleaver processes in accordance with an embodiment of the invention.

FIG. 6 is a process flow diagram of the codeword interleaver processes in accordance with an embodiment of the invention. Processing begins 600 with the determination of channel constraints based on: standard, operator, and training constraints. Constraints include: latency minimum and maximum, impulse noise protection, codeword efficiency and line rate. Next in process 602 the interleaver parameters M, I, and k are determined. Then in process 604 any signaling to the remote modem is effected. Next in decision process 606 a determination of whether any adjustment in interleaver parameters is taking place. If no adjustment is taking place then control passes to process 614. In process 614 the number, size, write order, and read order of the v-FIFOs is determined based on the interleaver parameters established in process 602. The elements of each interleaver block from the incoming communication channel are written in order starting with the smallest v-FIFO and ending with the largest v-FIFO as discussed above in connection with Equation 3. Read order corresponds with Equation 4 as discussed above. Next in process 616 the v-FIFOs are virtualized in the interleavers memory by means of a start pointer and pointer offsets to the remaining write and read pointers for all v-FIFOs. Control then passes to process 618.

Processes 618-624 are the steady state processes associated with interleaving the communication channel when interleaver parameters are unchanged. In process 618 the next block of I elements from the incoming communication channel is obtained. Then in process 620 these elements are written in the order obtained from the incoming communication channel to memory in order from smallest to largest v-FIFO in accordance with the above discussed Equation 3. Next in process 622 the outputs of each v-FIFO are read out from the output of each v-FIFO in an order determined by the above discussed Equation 4. Then in process 624 the interleaver block cycle begun in process 618 is completed with a shift of all write and read pointers and associated v-FIFOs by one unit of memory, e.g. one byte. If one of the pointers has reached a memory boundary that pointer is wrapped as discussed above. If no change in interleaver parameters is detected in decision process 626, control returns to process 618 for the processing of the next interleaver block of I elements.

Alternately if interleaver parameters are changed, e.g. in response to line conditions, control returns to process 602. Then in process 604 the impending changeover is signaled to the remote modem. In the case of an increase or decrease in either the size or number of v-FIFOs that information is signaled to the remote modem in process 604 along with information as to how much data will be discarded during the changeover.

Next in decision process 606 a determination as to whether the revised interleaver parameters will result in an increase or decrease in buffer size or number. If interleaver parameters changes will result in an increase in v-FIFO size or number then control passes directly to process 614. If revised interleaver parameters will result in a decrease in depth then control passes to processes 608-612. In process 608 the read pointers in the current state are saved. Then in process 610 the next Delta L blocks of stored data are read from the v-FIFOs using current depth settings where delta_L is the size of the last v-FIFO with current depth minus the v-FIFO's size of the last v-FIFO with new depth, as in the following Equation 5A:

$$\text{Delta}\_L = ABS((I-1)(M_1-M_2) + \text{FLOOR}((I-1) \cdot k_1/I) - \text{FLOOR}((I-1) \cdot k_2/I)) \quad \text{Equation 5A}$$

where current depth is $M_1.I+k_1$ and the new depth is $M_2.I+k_2$. During this reading the write pointers are fixed and no data from the communication channel is written to memory. As an alternate method, in process 610, the read could be done by incrementing the read pointers by delta_L and then using the new depth settings. Then in process 612 the read pointers are reset to the state saved in process 608 and any required signaling, if any, to the remote modem is effected. Control then passes to processes 614-616 in which the resizing takes place.

Figure 7:
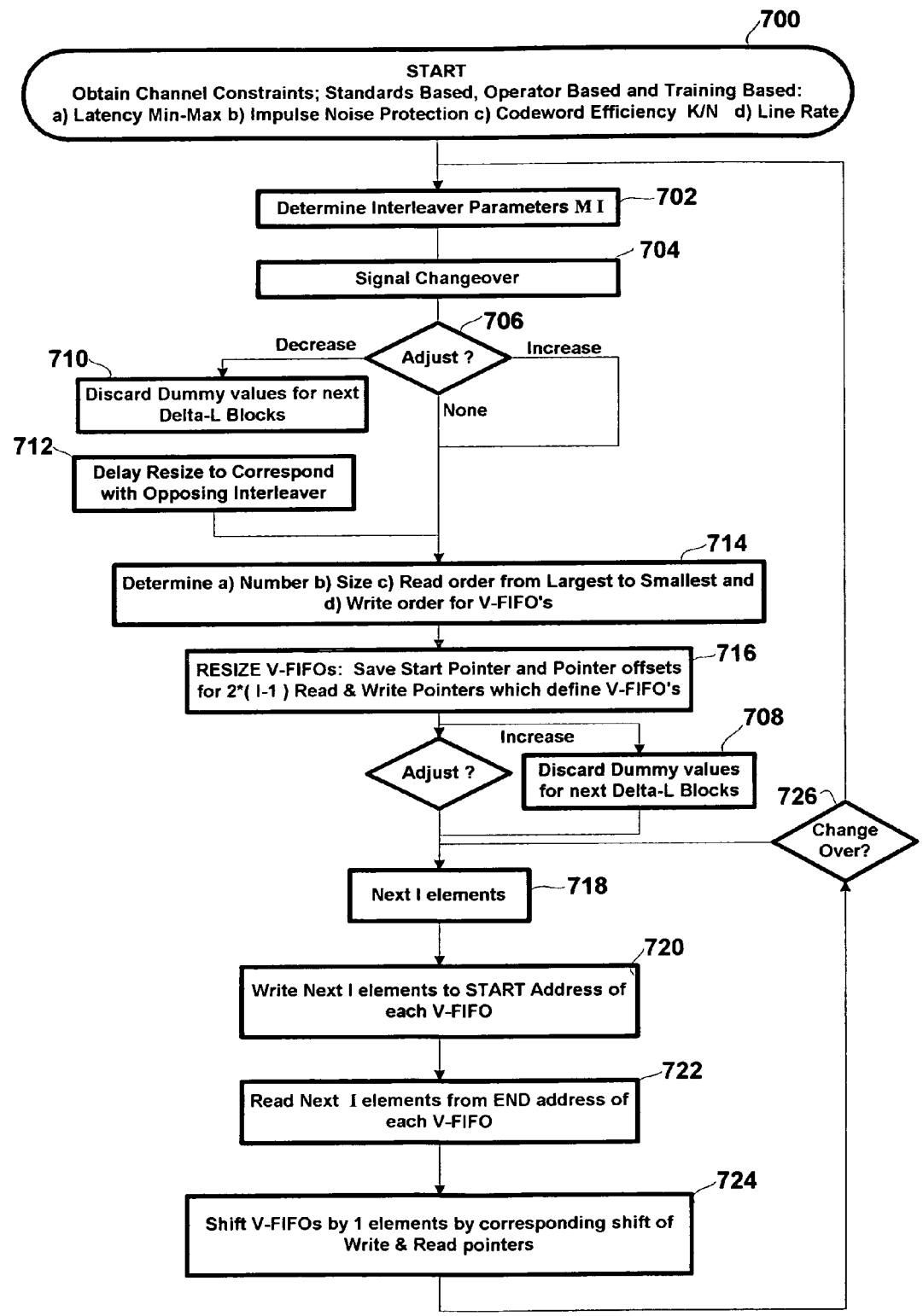
FIG. 7 is a process flow diagram of the codeword deinterleaver processes in accordance with an embodiment of the invention.

FIG. 7 is a process flow diagram of the codeword deinterleaver processes in accordance with an embodiment of the invention. Processing begins 700 with the determination of channel constraints based on: standard, operator, and training constraints. Next in process 702 the deinterleaver parameters M, I, and k are determined. Then in process 704 any signaling to the remote modem is effected. Next in decision process 706 a determination of whether any adjustment in deinterleaver parameters is taking place. If no adjustment is taking place then control passes to process 714. In process 714 the number, size, write order, and read order of the v-FIFOs is determined based on the deinterleaver parameters established in process 702. The elements of each deinterleaver block from the incoming interleaved communication channel are written in order discussed above in Equation 4. Read order corresponds with Equation 3 as discussed above from the largest to the smallest v-FIFO. Next in process 716 the v-FIFOs are virtualized in the deinterleaver's memory by means of a start pointer and pointer offsets to the remaining write and read pointers for all v-FIFOs. Control then passes to process 718.

Processes 718-724 are the steady state processes associated with deinterleaving the interleaved communication channel when deinterleaver parameters are unchanged. In process 718 the next block of I elements from the incoming interleaved communication channel is obtained. Then in process 720 these elements are written in the order obtained from the incoming communication channel to memory in order discussed above in Equation 4. Next in process 722 the outputs of each v-FIFO are read out from the output of each v-FIFO in an order determined by the above discussed Equation 3 from the largest to the smallest v-FIFO. Then in process 724 the deinterleaver block cycle begun in process 718 is completed with a shift of all write and read pointers and associated v-FIFOs by one unit of memory, e.g. one byte. If one of the pointers has reached a memory boundary that pointer is wrapped as discussed above. If no change in deinterleaver parameters is detected in decision process 726, control returns to process 718 for the processing of the next deinterleaver block of I elements.

Alternately if interleaver parameters are changed, e.g. in response to line conditions, control returns to process 702. Then in process 704 the impending changeover signaling is effected with the remote modem. In the case of an increase or decrease in either the size or number of v-FIFOs that information is exchanged with the remote modem in process 704 along with information as to how much data will be discarded during the changeover.

Next in decision process 706 a determination as to whether the revised deinterleaver parameters will result in an increase or decrease in buffer depth. If deinterleaver parameter changes will result in an increase in v-FIFO depth then control passes to process 714 and 716, so that the v-FIFO sizes and the read and write pointers are recalculated for the new depth after which control passes to process 708. In process 708 the dummy bytes present in the next delta L blocks of data are discarded while writing to the v-FIFOs without doing any read, where delta L is the size of the last v-FIFO with current depth minus the size of the last v-FIFO with new depth, as in the following Equation 5B:

$$\text{Delta\_}L = ABS((I-1)(M_1 - M_2) + \text{FLOOR}((I-1) \cdot k_1/I) - \text{FLOOR}((I-1) \cdot k_2/I)) \quad \text{Equation 5B}$$

where current depth is $M_1 \cdot I + k_1$ and the new depth is $M_2 \cdot I + k_2$. Control then passes to process 718.

Alternately, if in decision process 706 a determination is made that revised deinterleaver parameters will result in a decrease in depth then control passes to processes 710-712. In process 710 the dummy bytes present in the next delta L blocks of data are discarded while writing to the v-FIFOs. Then in process 712, after an appropriate delay, timed to coincide with a resize on the remote modem, the resizing is initiated, and control is passed to processes 714-716 in which the resizing takes place.

In alternate embodiments of the invention the v-FIFOs may be separated from one another by padding blocks. In an alternate embodiment of the invention the write and read pointers may be stored in a lookup table and shifted first in the lookup table then in memory on each interleaver block cycle. In still another embodiment of the invention the first write pointer only, may be saved and shifted in a lookup table with the remaining pointers generated on the fly from the corresponding ones of Equations 2A, 2B, 3 and 4.

EXAMPLES

A General Convolutional interleaver allows the depth to be of the form $D = (M \times I) + k$, where k is in the range 1 to I–1. Thus, the only restriction on D is that D and I are co-prime.

Example 1

Interleaver

In the following example: I=4, M=1, k=3, and $D = m \times I + k = 7$. The blocks of data being written into the memory are:

A0 A1 A2 A3 B0 B1 B2 B3 C0 C1 C2 C3 D0 D1 D2 D3 E0 E1 E2 E3 F0 F1 F2 F3

The first block written to memory is A0 to A3, with A0 is the first data value written followed by A1 etc. Similarly B0 to B3 is the second block written, C0 to C3 is the third block written and so on. The sequence of data values read out is shown below. Initially, some of the values read are values which are not written and these are shown as '--' below (these will be overwritten in the de-interleaver and hence the actual values are not important):

A0 -- -- -- B0 -- -- A1 C0 -- -- B1 D0 -- A2 C1 E0 -- B2 D1 F0 A3 C2 E1 G0 B3 D2 F1

Here, A0 is the first value read out and F1 the last value read out. The v-FIFOs for this example, after F0 to F3 is written and just before F0 is read are shown below. The v-FIFO for the $j^{th}$ element in a block is identified as v-FIFO_j.

| | |
|---|---|
| v-FIFO_0: | F0 |
| v-FIFO_1: | F1 E1 |
| v-FIFO_2: | F2 E2 D2 C2 |
| v-FIFO_3: | F3 E3 D3 C3 B3 A3 |

The v-FIFO_1 has one more element than v-FIFO_0, but v-FIFO_2 has two more elements than v-FIFO_1 and the v-FIFO_3 has two more elements than v-FIFO_2. The reading is done by reading last element of v-FIFOs in the following order: 0, 3, 2, 1, to get F0, A3, C2, E1, and after this, the v-FIFOs look like:

| |
|---|
| — |
| F1 — |
| F2 E2 D2 — |
| F3 E3 D3 C3 B3 — |

Now the shift operation is performed on the v-FIFOs via a uniform shift of the corresponding write and read pointers.

|  |
| --- |
| — F1 |
| — F2 E2 D2 |
| — F3 E3 D3 C3 B3 |

After G0 to G3 is written the v-FIFOs are as follows:

|  |
| --- |
| G0 |
| G1 F1 |
| G2 F2 E2 D2 |
| G3 F3 E3 D3 C3 B3 |

The v-FIFOs are again read in the order 0, 3, 2, 1 to readout data elements G0 B3 D2 F1. The v-FIFO sizes in the above case are 1, 2, 4, and 6.

The v-FIFOs are read in order: 0, k, (2k mod I), (3k mod I), . . . , ((I−1)k mod I). The size of v-FIFO numbered 'i', can be calculated as 1+iM+floor((ik)/I). Thus, for v-FIFO_2, the size is 1+2*1+floor((2*3)/4)=4. This sizing allows one interleaver block to be written before the first read which is useful from a overall pipelining of the system dataflow. Writing one data element followed by a read of a data element (i.e., alternating write and read of data elements) allows the size of each v-FIFO to be reduced by 1, thus reducing a total of 'I−1' elements.

Example 2

Interleaver

In this example I=8, m=0, k=5, D=5. The v-FIFOs after the block E0 to E7 is written and just before E0 is read.

|  |
| --- |
| E0 |
| E1 |
| E2 D2 |
| E3 D3 |
| E4 D4 C4 |
| E5 D5 C5 B5 |
| E6 D6 C6 B6 |
| E7 D7 C7 B7 A7 |

The v-FIFOs are read in order: 0, k, (2k mod I), (3k mod I), . . . , ((I−1)k mod I), which in this case gives the order of reading v-FIFOs as: 0, 5, 2, 7, 4, 1, 6, 3. The next set of values read out are:

E0 B5 D2 A7 C4 E1 B6 D3;

The size of v-FIFO numbered 'i', can be calculated as 1+iM+ Floor((ik)/I). In this case, the sizes of the v-FIFOs 0 to 7 are: 1, 1, 2, 2, 3, 4, 4, 5.

Resizing:

To support dynamic change of depth, each vFIFO is sized for the max depth desired based on available interleaver memory and interleaver block size. The portion of a v-FIFO used at a given time is based on the actual depth at that time, with the remaining bytes being treated as padding bytes.

An interleaver depth increase may be processed in an embodiment of the invention by: increasing the end position of each v-FIFO with a corresponding reduction in the padding; recalculating the size of the v-FIFOs and the write and read pointer address offsets for new depth; followed by a resumption of interleaving with the new depth. Some data read out & sent is undefined due to reading from the increased portions of each v-FIFO, and these "dummy" values are not used by deinterleaver.

An interleaver depth decrease may be processed in an embodiment of the invention by: decreasing the end position of each V-FIFO with a corresponding increase in padding and then in a transition phase halting the writing of new data into the v-FIFOs and reading out values in the current v-FIFOs that will not be in the v-FIFOs after the resize. Read out may be accomplished using either the current or new depth, in either case undefined or redundant data are not used by the opposing deinterleaver. The method used in the transition phase must be signaled or pre-arranged with the deinterleaver, so that it can discard the "dummy" values. The transition phase consists of 't' interleaver blocks, where t is change in depth of the largest of the current v-FIFOs versus the v-FIFOs after resize. After the transition phase write and read and shift operations are resumed using the new v-FIFO depth settings.

Example 3

Resize

In the following example the interleaver depth 'D' decreases from 9 to 5 for an interleaver block size of I=4. The current interleaver sizing is: I=4, D=9 (M=2, k=1). The v-FIFOs after the next block, G0, G1, G2, G3, is written to memory are shown below, with the padding bytes not shown.

|  |
| --- |
| G0 |
| G1 F1 E1 |
| G2 F2 E2 D2 C2 |
| G3 F3 E3 D3 C3 B3 A3 |

Next the stored data at the outputs of the v-FIFOs are read out, i.e. G0, E1, C2, A3, and the v-FIFO after shifting is as follows:

|  |
| --- |
| — |
| — G1 F1 |
| — G2 F2 E2 D2 |
| — G3 F3 E3 D3 C3 B3 |

In this example, depth is now decreased to D=5 (m=1, k=1). In the transition period stored data is read out from interleaver without writing to it. Some values read out and sent are "dummy" values which are discarded by de-interleaver. In the example, the dummy values are shown as inside [ ].

Using the first of the two read-out methods discussed above, the current depth is used in the transition interval for read out of three blocks of stored data as follows:

| | | | |
| --- | --- | --- | --- |
| [—], | F1, | D2, | B3 |
| [—], | [G1], | E2, | C3 |
| [—], | [—], | [F2], | D3 |

The G1 and F2 are shown in [ ] since they will again be sent later when reading out with the new depth, and so in this read out G1 and F2 are treated as 'dummy' data values. Since no new data is written during the transition the G1 and F2 values after read out are not overwritten by some new value. Next the depth of the v-FIFOs is decreased. The write operation is resumed with the next block H0, H1, H2, H3 of data:

|       |       |       |       |
|-------|-------|-------|-------|
| H0    |       |       |       |
| H1    | G1    |       |       |
| H2    | G2    | F2    |       |
| H3    | G3    | F3    | E3    |

Next, read out H0, G1, F2, E3. Note that we read out again G1 and F2.

Using the second of the two read-out methods discussed above, the new depth is used in the transition interval for read out of stored data. The v-FIFOs at the time of the change, after adjusting to new depth are:

|    |    |    |    |    |    |
|----|----|----|----|----|----|
| —  | —  | —  | —  |    |    |
| —  | G1 | F1 | —  | —  |    |
| —  | G2 | F2 | E2 | D2 | —  |
| —  | G3 | F3 | E3 | D3 | C3 | B3 |

Successive blocks read, without write, are:

|      |      |      |     |
|------|------|------|-----|
| [—], | [—], | [—], | B3  |
| [—], | [—], | D2,  | C3  |
| [—], | F1,  | E2,  | D3  |

At the end of the transition write is resumed with a writing of the next block H0, H1, H2, H3 of data using the new depth:

|       |       |       |       |
|-------|-------|-------|-------|
| H0    |       |       |       |
| H1    | G1    |       |       |
| H2    | G2    | F2    |       |
| H3    | G3    | F3    | E3    |

This is followed by a read operation in which stored elements H0, G1, F2, E3 are read.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A modem having shared and discrete components forming a transmit path and a receive path configured to couple to a communication medium for establishing a communication channel thereon, and the modem comprising:
an interleaver component for interleaving the communication channel, and the interleaver component configurable as to interleaver parameters 'I, D" corresponding to block length and depth respectively; and the interleaver including:
a memory for buffering the communication channel; and
a controller controlling writing to and reading from the memory of successive data elements of the communication channel with a quantity 'I' pairs of write and read pointers with each pair identifying memory locations corresponding with an input and output respectively of an associated one of 'I' virtual first-in-first-out ('v-FIFO') buffers in the memory; and with control of the pointers required to read out the stored data elements in interleaved fashion, limited to shifting all pointers uniformly by one address block in each interleaver block cycle; thereby simplifying pointer management.

2. The controller of claim 1, establishing a fixed offset between a given pair of write and read pointers and hence a length of an associated v-FIFO buffer which corresponds to one of:
I+iM+FLOOR(ik/I); where writing of all data elements in each interleaver block cycle is completed before readout of stored data elements; and
iM+FLOOR(ik/I) where write and read of individual data elements are alternated in each interleaver block cycle;
where 'i' ranges from 0 to (I−1).

3. The controller of claim 1, establishing a fixed write order (i) for writing successive data elements of the communication channel to the locations in memory identified by the write pointers and a fixed read order (ik MOD I) for reading stored data elements from the locations in memory identified by the read pointers, where 'i' corresponds to an index identifying both a v-FIFO buffer together with an associated write and read pointer pair, and where 'i' ranges from 0 to (I−1).

4. The controller of claim 1, responsive to a change in interleaver parameters to redetermine at least one of a number of read write pointer pairs and a spacing between a given pair of read write pointers.

5. The modem of claim 1, further comprising:
a deinterleaver component for deinterleaving the communication channel, and the deinterleaver component configurable as to deinterleaver parameters 'I, D" corresponding to block length and depth respectively; and the deinterleaver including:
a memory for buffering the communication channel; and
a controller controlling writing to and reading from the memory of successive data elements of the communication channel with a quantity 'I' pairs of write and read pointers with each pair identifying memory locations corresponding with an input and output respectively of an associated one of 'I' virtual first-in-first-out ('v-FIFO') buffers in the memory; and with control of the pointers required to read out the stored data elements in deinterleaved fashion, limited to shifting all pointers uniformly by one address block in each deinterleaver block cycle; thereby simplifying pointer management.

6. The deinterleaver controller of claim 5, establishing a fixed offset between a given pair of write and read pointers and hence a length of an associated v-FIFO buffer which corresponds to one of:
1+(I−1−i)M+FLOOR((I−1−i)k/I); where writing of all data elements in each interleaver block cycle is completed before readout of stored data elements; and
(I−1−i)M+FLOOR((I−1−i)k/I) where write and read of individual data elements are alternated in each interleaver block cycle;
where 'i' ranges from 0 to (I−1).

7. The deinterleaver controller of claim 5, establishing a fixed write order (ik MOD I) for writing successive data elements of the communication channel to the locations in memory identified by the write pointers and a fixed read order (i) for reading stored data elements from the locations in memory identified by the read pointers, where 'i' corresponds to an index identifying both a v-FIFO buffer together with an associated write and read pointer pair, and where 'i' ranges from 0 to (I−1).

8. The deinterleaver controller of claim 5, responsive to a change in deinterleaver parameters to redetermine at least one of a number of read write pointer pairs and a spacing between a given pair of read write pointers.

9. A method for operating an interleaver in a modem having shared and discrete components forming a transmit path and a receive path configured to couple to a communication medium for establishing a communication channel thereon, and the method comprising:
   determining interleaver parameters 'I, D" corresponding to block length and depth respectively for interleaving the communication channel;
   buffering the communication channel;
   controlling writing to and reading in the buffering act of successive data elements of the communication channel with a quantity 'I' pairs of write and read pointers for interleaving the communication channel and with each pair identifying locations corresponding with an input and output respectively of an associated one of 'I' virtual first-in-first-out ('v-FIFO') buffers; and
   shifting all pointers uniformly by one address block in each interleaver block cycle, thereby simplifying pointer management required to interleave the communication channel.

10. The method of claim 9 further comprising the act of:
   establishing a fixed offset between a given pair of write and read pointers for interleaving the communication channel and hence a length of an associated v-FIFO buffer which corresponds to one of:
      $1+iM+FLOOR(ik/I)$; where writing of all data elements in each interleaver block cycle is completed before readout of stored data elements; and
      $iM+FLOOR(ik/I)$ where write and read of individual data elements are alternated in each interleaver block cycle;
   where 'i' ranges from 0 to (I−1).

11. The method of claim 9 further comprising the act of:
   establishing, for the write and read pointers for interleaving the communication channel, both a fixed write order (i) for writing successive data elements of the communication channel to the locations identified by the write pointers together with a fixed read order (ik MOD I) for reading stored data elements from the locations identified by the read pointers, where 'i' corresponds to an index identifying both a v-FIFO buffer together with an associated write and read pointer pair, and where 'i' ranges from 0 to (I−1).

12. The method of claim 9 further comprising the acts of:
   changing the interleaver parameters; and
   redetermining at least one of a number of read write pointer pairs and a spacing between a given pair of read write pointers responsive to the change of the interleaver parameters in the changing act.

13. The method of claim 9 further comprising the acts of:
   determining deinterleaver parameters 'I, D" corresponding to block length and depth respectively for deinterleaving the communication channel;
   buffering the communication channel;
   controlling writing to and reading in the buffering act of successive data elements of the communication channel with a quantity 'I' pairs of write and read pointers for deinterleaving the communication channel with each pair identifying locations corresponding with an input and output respectively of an associated one of 'I' virtual first-in-first-out ('v-FIFO') buffers; and
   shifting all pointers uniformly by one address block in each deinterleaver block cycle, thereby simplifying pointer management required to deinterleave the communication channel.

14. The method of claim 13 further comprising the act of:
   establishing a fixed offset between a given pair of write and read pointers for deinterleaving the communication channel and hence a length of an associated v-FIFO buffer which corresponds to:
      $1+(I-1-i)M+FLOOR((I-1-i)k/I)$; where writing of all data elements in each interleaver block cycle is completed before readout of stored data elements; and
      $(I-1-i)M+FLOOR((I-1-i)k/I)$ where write and read of individual data elements are alternated in each interleaver block cycle;
   where 'i' ranges from 0 to (I−1).

15. The method of claim 13 further comprising the act of:
   establishing, for the write and read pointers for deinterleaving the communication channel, both a fixed write order (ik MOD I) for writing successive data elements of the communication channel to the locations identified by the write pointers together with a fixed read order (i) for reading stored data elements from the locations identified by the read pointers, where 'i' corresponds to an index identifying both a v-FIFO buffer together with an associated write and read pointer pair, and where 'i' ranges from 0 to (I−1).

16. The method of claim 13 further comprising the acts of:
   changing deinterleaving parameters; and
   redetermining at least one of a number of read write pointer pairs and a spacing between a given pair of read write pointers responsive to the change of deinterleaver parameters in the changing act.

\* \* \* \* \*